(12) United States Patent
Wang et al.

(10) Patent No.: US 11,217,697 B2
(45) Date of Patent: Jan. 4, 2022

(54) THIN-FILM TRANSISTOR AND MANUFACTURING METHOD THEREFOR, ARRAY SUBSTRATE AND DISPLAY DEVICE

(71) Applicant: BOE TECHNOLOGY GROUP CO., LTD., Beijing (CN)

(72) Inventors: Lizhong Wang, Beijing (CN); Tianmin Zhou, Beijing (CN); Yu Wen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/615,358

(22) PCT Filed: Apr. 20, 2018

(86) PCT No.: PCT/CN2018/083984
§ 371 (c)(1),
(2) Date: Nov. 20, 2019

(87) PCT Pub. No.: WO2019/001115
PCT Pub. Date: Jan. 3, 2019

(65) Prior Publication Data
US 2020/0176612 A1 Jun. 4, 2020

(30) Foreign Application Priority Data

Jun. 30, 2017 (CN) .......................... 201710527541.3

(51) Int. Cl.
*H01L 29/786* (2006.01)
*H01L 21/02* (2006.01)
(Continued)

(52) U.S. Cl.
CPC .... *H01L 29/78675* (2013.01); *H01L 21/0262* (2013.01); *H01L 21/02532* (2013.01);
(Continued)

(58) Field of Classification Search
CPC ............. H01L 29/4908; H01L 29/4916; H01L 29/78672; H01L 29/78675;
(Continued)

(56) References Cited

U.S. PATENT DOCUMENTS

| 5,943,574 A | 8/1999 | Tehrani et al. |
| 6,541,323 B2 | 4/2003 | Yang et al. |

(Continued)

FOREIGN PATENT DOCUMENTS

| CN | 102176413 A | 9/2011 |
| CN | 102881657 A | 1/2013 |

(Continued)

OTHER PUBLICATIONS

Chinese Office Action dated Feb. 19, 2020, from application No. 201710527541.3.
(Continued)

*Primary Examiner* — Thanhha S Pham
(74) *Attorney, Agent, or Firm* — Thomas | Horstemeyer, LLP

(57) ABSTRACT

An active layer of the thin-film transistor includes a channel region, a source region and a drain region. The source region and the drain region are respectively arranged on both sides of the channel region, and the channel region includes a polycrystalline silicon structure doped with a fifth group element. A potential difference between the source-drain region and the channel region is increased by doping with the fifth group element.

19 Claims, 1 Drawing Sheet

(51) Int. Cl.
*H01L 29/66* (2006.01)
*H01L 29/10* (2006.01)
*H01L 29/167* (2006.01)

(52) U.S. Cl.
CPC .. *H01L 21/02592* (2013.01); *H01L 21/02667* (2013.01); *H01L 29/1033* (2013.01); *H01L 29/167* (2013.01); *H01L 29/66757* (2013.01); *H01L 29/78603* (2013.01)

(58) Field of Classification Search
CPC ........... H01L 29/78678; H01L 29/6675; H01L 29/66757; H01L 29/66765; H01L 21/02532; H01L 21/02592; H01L 21/02667; H01L 27/1222
See application file for complete search history.

(56) References Cited

U.S. PATENT DOCUMENTS

| | | | |
|---|---|---|---|
| 9,620,532 | B2 | 4/2017 | Chen et al. |
| 2002/0102781 | A1 | 8/2002 | Yang et al. |
| 2002/0192884 | A1 | 12/2002 | Chang et al. |
| 2003/0013280 | A1* | 1/2003 | Yamanaka ........ H01L 21/02535 438/487 |
| 2016/0111454 | A1* | 4/2016 | Chen .................... H01L 29/788 345/214 |
| 2016/0268319 | A1* | 9/2016 | Long ................... H01L 27/1255 |
| 2020/0219423 | A1* | 7/2020 | Okabe .................... G09F 9/301 |

FOREIGN PATENT DOCUMENTS

| | | |
|---|---|---|
| CN | 103199116 A | 7/2013 |
| CN | 106298948 A | 1/2017 |
| CN | 107275390 A | 10/2017 |
| JP | 2007-258282 A | 10/2007 |

OTHER PUBLICATIONS

Chinese Office Action dated Jul. 25, 2019, from application No. 201710527541.3.

International Search Report and Written Opinion dated Jul. 20, 2018, from application No. PCT/CN2018/083984.

* cited by examiner

THIN-FILM TRANSISTOR AND MANUFACTURING METHOD THEREFOR, ARRAY SUBSTRATE AND DISPLAY DEVICE

CROSS-REFERENCE TO RELATED APPLICATIONS

This application is based on International Application No. PCT/CN2018/083984, filed on Apr. 20, 2018, which is based on and claims priority to and benefit of Chinese patent application No. 201710527541.3, filed on Jun. 30, 2017, the entire contents of which are incorporated herein by reference.

TECHNICAL FIELD

The present disclosure relates to a thin-film transistor manufacturing and display field, in particular to a thin-film transistor and a manufacturing method therefor, an array substrate and a display device.

BACKGROUND

Recently, with increasing technical development of polycrystalline silicon thin-film transistor, it, especially a low temperature polycrystalline silicon thin-film transistor (LTPS TFT) has been put into use more widely. Due to high reaction speed, high aperture ratio, high brightness and other advantages, the polycrystalline silicon thin-film transistor becomes popular in the market, and also can be used in the field of a flexible display and an organic light emitting diode display. However, the leakage current of the low-temperature polycrystalline silicon film generally shows a very high value due to a large number of disadvantages existed in the film, which limits the application of the low-temperature polycrystalline silicon film in the display field.

SUMMARY

According to one aspect of present disclosure, a thin-film transistor includes a channel region, a source region and a drain region; the source region and the drain region being respectively arranged on both sides of the channel region; and the channel region includes a polycrystalline silicon structure doped with a fifth group element.

In an arrangement of the present disclosure, a doping concentration of the fifth group element is $1E11 \sim 1E12 \text{ cm}^{-3}$.

In an arrangement of the present disclosure, the fifth group element is phosphorus or arsenic.

In an arrangement of the present disclosure, the thin-film transistor is an N-type thin-film transistor.

In an arrangement of the present disclosure, the source region and the drain region are polycrystalline silicon doped with boron ions, and a doping concentration of the boron ions is $1E15 \sim 5E15 \text{ cm}^{-3}$.

In an arrangement of the present disclosure, the thin-film transistor further includes a substrate, a buffer layer, and a gate insulating layer. The buffer layer is located on one side of the substrate; and an active layer, a gate insulating layer, and a gate are sequentially laminated on one side of the buffer layer away from the substrate; and the gate corresponds to a position of the channel region.

In an arrangement of the present disclosure, the substrate includes a base substrate and a polyimide resin formed on the base substrate, and the base substrate is a glass base substrate or a flexible base substrate.

In an arrangement of the present disclosure, the buffer layer has a two-layer structure.

In an arrangement of the present disclosure, the buffer layer includes a SiN layer and a $SiO_2$ layer formed on the SiN layer.

According to another aspect of present disclosure, a manufacturing method of a thin-film transistor, includes forming an active layer of the thin-film transistor; the active layer comprising a channel region which is a polycrystalline silicon structure doped with a fifth group element.

In an arrangement of the present disclosure, forming the active layer of the thin-film transistor includes: forming an amorphous silicon layer doped with the fifth group element through a film forming process, crystallizing the amorphous silicon, and forming a polycrystalline silicon layer doped with the fifth group element.

In an arrangement of the present disclosure, reaction gases employed in forming the amorphous silicon layer doped with the fifth group element are $H_2$, $PH_3$ and $SiH_4$, a gas ratio is 1:0.15-0.35:0.1-0.3, and a reaction temperature is 250° C.-450° C.

In an arrangement of the present disclosure, forming the active layer of the thin-film transistor includes: manufacturing a polycrystalline silicon layer through a film forming process, and doping the ions to the polycrystalline silicon layer. The ions are the ions of the fifth group element, such that the polycrystalline silicon layer doped with the fifth group element is formed.

In an arrangement of the present disclosure, after forming the polycrystalline silicon layer doped with fifth group elements, the method further includes: forming a gate of the thin-film transistor on the polycrystalline silicon layer, using the gate as a mask, doping the active layer with the boron ions to form a source region and a drain region of the active layer. The doping concentration of the boron ion is $1E15 \sim 5E15 \text{ cm}^{-3}$.

According to another aspect of present disclosure, the present disclosure further discloses an array substrate. The array substrate includes the thin-film transistor according to any one of the above technical solutions.

According to another aspect of present disclosure, the present disclosure further discloses a display device. The display device includes the array substrate.

DETAILED DESCRIPTION

Figure 1:
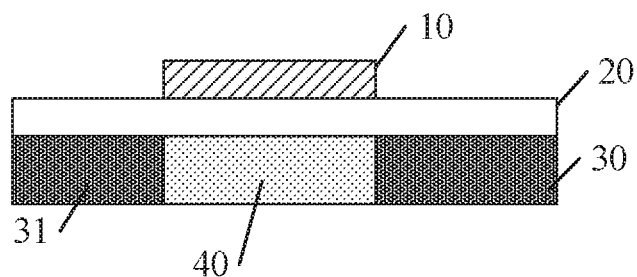
FIG. 1 is a schematic partial structural view of a thin-film transistor provided by the present disclosure.

In order to make the purpose and the technical scheme of the arrangements of the present disclosure clearer, the present disclosure will be further described below with reference to the drawings and exemplary arrangements. Obviously, the described arrangements are a part of the arrangements of the present disclosure, not all of the arrangements. Based on the arrangements of the present disclosure, all other arrangements obtained by those ordinary skilled in the art without any creative work are within the protection scope of the present disclosure. It should be noted that the same reference numbers in the drawings refer to the same components throughout. In addition, if a detailed description of the known technology is not necessary to illustrate the features of the present disclosure, the detailed description will be omitted.

The present disclosure is directed to provide a thin-film transistor and a manufacturing method thereof, an array substrate and a display device, which increases a potential difference of a PN junction, and reduces off-state current through an ion doping method.

A schematic local structural view of a thin-film transistor provided by the present disclosure is shown in FIG. 1. An active layer of the thin-film transistor includes a channel region 40, a source region 31 and a drain region 30. The source region 31 and the drain region 30 are respectively disposed on both sides of the channel region 40, and the channel region 40 includes a polycrystalline silicon structure doped with a fifth group element.

The fifth group element has a doping concentration of $1E11 \sim 1E12$ $cm^{-3}$.

The fifth group element is added into the channel region to form an N-type thin-film transistor. The fifth group element is preferably phosphorus or arsenic.

This example takes an example of the phosphorus to illustrate the technical solution of the present disclosure. Phosphorus ions are doped in the channel region to form an N-channel. The present disclosure sets the doping concentration of phosphorus ions (P+) to $1E111-1E12$ $cm^{-3}$, for example, the doping concentration can be $3E11$ $cm^{-3}$, $7E11$ $cm^{-3}$, $9E11$ $cm^{-3}$, etc. As the phosphorus ions are donor impurities, to provide electronic carriers, so as to increase the doping concentration of the phosphorus ions, i.e., to increase the concentration of electrons in the channel region, and to reduce a potential in the channel region, that is, the potential in the channel region will be reduced along with the increasing of the doping concentration within the concentration range, so that the potential difference between the channel region and the source-drain region is increased.

Figure 3:
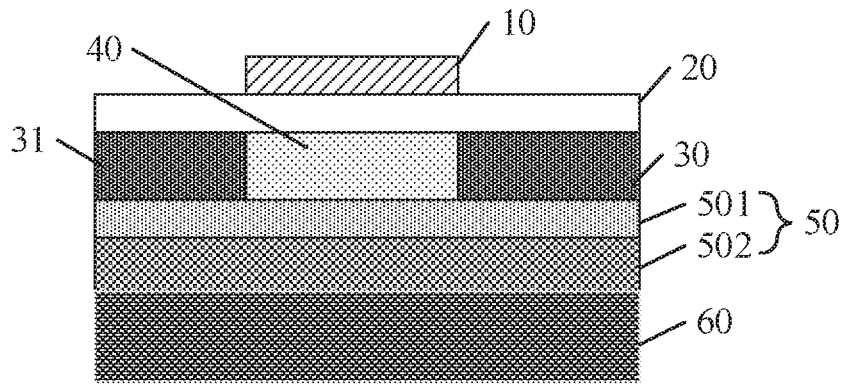
FIG. 3 shows a schematic overall structural view of the thin-film transistor provided by the present disclosure.

As shown in FIG. 3, the thin-film transistor further includes a substrate 60, a buffer layer 50, and a gate insulating layer 20. The buffer layer is on one side of the substrate, the active layer formed by the source region 31, the drain region 30, and the channel region 40 is formed on the side of the buffer layer away from the substrate, the gate insulating layer is formed on the side of the active layer away from the substrate, and the gate is formed on the side of the gate insulating layer away from the substrate, and corresponds to a position of the channel region.

The substrate includes a base substrate and a polyimide resin (PI) formed on the base substrate, and materials of the base substrate are not limited, and may be glass, quartz or flexible base substrate.

The buffer layer includes a two-layer structure, i.e., a SiN layer 502 in direct contact with the buffer layer and a $SiO_2$ layer 501 formed on the SiN layer.

Specifically, thickness of the SiN layer in direct contact with PI is 30-100 nm, and thickness of the $SiO_2$ layer is 20-40 nm.

A buffer layer with an appropriate thickness can effectively prevent a diffusion effect of metal ions caused by subsequent high-temperature processes. For example, a SiN layer with the thickness of about 50 nm has a significant effect on blocking pollutants from a glass substrate. Adjustment of the thickness or deposition conditions of the buffer layer may improve quality of a back surface of the polycrystalline silicon and prevent electric leakage on the back surface of the polycrystalline silicon.

In a crystallization process, the double-layer buffer layer can reduce heat conduction, and can slow down a rate of cooling the silicon heated by a laser, and thus facilitate forming larger crystal grains.

The source region and the drain region of the thin-film transistor are polycrystalline silicon doped with boron ions (B+), and the doping concentration of the boron ions (B+) in the source region and the drain region provided by the present disclosure is $1E15 \sim 5E15$ $cm^{-3}$. The boron ions with such concentration are added to increase the concentration of hole carriers in the source-drain region, so as to increase the potentials of the source region and the drain region, increase a potential barrier between the source-drain region and the channel region, and reduce the leakage current generated between the source-drain region and the channel region.

The present disclosure also provides a manufacturing method of the thin-film transistor, which includes forming an active layer of the thin-film transistor. The active layer includes a channel region which is a polycrystalline silicon structure doped with a fifth group element.

Forming the active layer of the thin-film transistor includes forming an amorphous silicon layer doped with the fifth group element through a film forming process, and crystallizing the amorphous silicon to form the polycrystalline silicon layer doped with the fifth group element.

Figure 2:
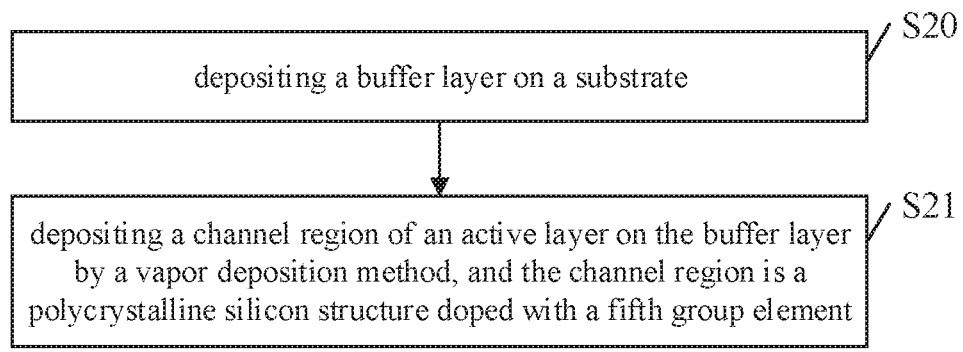
FIG. 2 is a flow chart of a method for manufacturing the thin-film transistor provided by the present disclosure.

Referring to FIG. 2, the present disclosure provides a flow chart of a manufacturing method of a thin-film transistor. The method includes block S20: depositing a buffer layer on the substrate.

Specifically, PI is coated on the base substrate as provided to form a substrate. The base substrate may be a glass, a quartz or a plastic flexible substrate. When cleanliness of the deposited substrate does not meet the requirements, the base substrate is first pre-cleaned.

Specifically, a buffer layer is deposited on the substrate by a vapor deposition method, and the buffer layer includes two layers. A SiN layer having a thickness of 30-100 nm is in contact with PI, and then a $SiO_2$ layer having a thickness of 20-40 nm is also deposited on SiN by the vapor deposition method.

Depositing the buffer layer on the substrate, on the one hand, can improve an adhesion degree between the amorphous silicon to be formed and the substrate, and on the other hand, can prevent metal ions deposed in the substrate from diffusing to the source region and the drain region, reduce a defect center, reduce generation of the leakage current, and thus reduce off-state current.

The method includes block S21: depositing the channel region of the active layer on the buffer layer by the vapor deposition method. The channel region is a polycrystalline silicon structure doped with the fifth group element.

In this arrangement, the technical solution of the present disclosure is illustrated as an example of phosphorus in fifth group element. Firstly, an amorphous silicon layer doped with phosphorus ions (P+) is formed on the buffer layer by the vapor deposition method, and then the amorphous silicon layer is subjected to crystallization process treatment to form a polycrystalline silicon layer doped with phosphorus ions (P+). The source region and the drain region of the active layer may also be simultaneously formed by depositing the channel region.

As compared with other deposition methods, the vapor deposition method is simple and can greatly improve utilization rate of the materials.

Specifically, a reaction device adopting the vapor deposition method is adopted. Reaction gases are $H_2$, $PH_3$ and SiH$_4$, a gas ratio is 1:0.15-0.35:0.1-0.3, and a reaction temperature is between 250° C. and 450° C., the substrate deposited with the buffer layer is placed in a reaction chamber, which may be a furnace tube type reaction chamber or a single wafer reaction furnace, and the reaction gas is introduced into the reaction chamber to carry out vapor deposition process so as to form an N-type doped amorphous silicon film layer.

Specifically, the vapor deposition method ionizes the reaction gas by means of microwave or radio frequency to form plasma locally, and the plasma has strong chemical activity and is easy to react to deposit amorphous silicon thin film on the substrate. The reaction is promoted by activity of the plasma, so that the chemical reaction can be carried out at a lower temperature. The vapor deposition method has the advantages of fast deposition rate, good film forming quality, less vacuum and avoiding ion pollution caused by high temperature.

Phosphorus ions are doped in the deposition process of the amorphous silicon film layer to form an N-type channel. According to the present disclosure, the phosphorus ions are doped in polycrystalline silicon. The phosphorus is a donor impurity, to provide electronic carriers so as to improve the doping concentration of the phosphorus ions, i.e., the concentration of electrons in the channel region is increased, so that the potential in the channel region is reduced, and the PN junction potential difference is increased.

Doping phosphorus in the process of depositing amorphous silicon layer can make distribution of the phosphorus ions uniform and make the manufacturing process simple, to avoid relevant defects and undesirable phenomena of the thin-film transistors caused by the ion introduction, and improve the performance of the thin-film transistors.

In another arrangement, an amorphous silicon layer is deposited on the buffer layer by the vapor deposition method, the reactive gases of the amorphous silicon are SiH$_4$ and H$_2$, and the amorphous silicon layer is crystallized. For example, the amorphous silicon film layer is subjected to a thermal annealing process, that is, an excimer laser annealing process is performed to form a polycrystalline silicon layer. A grid and a grid insulating layer are deposited on the polycrystalline silicon layer, and after the grid insulating layer is formed, the phosphorus ions are introduced into the channel region to form an N-type doped polycrystalline silicon layer. The concentration of phosphorus ions is 1E11~1E12 cm$^{-3}$.

Doping the phosphorus ions by the ion introduction can accurately control the doping concentration, doping distribution and doping depth of the phosphorus ions, and the implantation temperature is relatively low, to avoid adverse effects, such as junction shifting, thermal defects, silicon wafer deformation, caused by the high-temperature processes.

It should be noted that the crystallization process for the amorphous silicon layer is not limited to a thermal annealing process for the amorphous silicon layer, other methods, such as metal induced lateral crystallization, etc., and crystallization means as well known to those skilled in the art are also included within the protection scope of the present disclosure.

Further, as depositing the amorphous silicon film layer, a catalyst, such as B2H6, can be added to accelerate the deposition rate of the amorphous silicon or the polycrystalline silicon, and also reduce probability of changing the polycrystalline silicon structure due to reduction of the temperature.

In another arrangement, after a source region and a drain region are formed by etching, the ions are introduced into the source region and the drain region, and the doping concentration of the boron ions is set to be 1E15~5E15 cm$^{-3}$.

Specifically, after the polycrystalline silicon layer doped with the fifth group element is formed, the method further includes: forming a gate of the thin-film transistor on the polycrystalline silicon layer, using the gate as a mask, and doping the active layer with boron ions to form the source region and the drain region, which are doped with the boron ions. The doping concentration of the boron ions is 1E15~5E15 cm$^{-3}$.

It should be noted that other acceptor impurities, such as aluminum (Al), gallium (Ga), indium (In), etc., capable of providing holes are also within the protection scope of the present disclosure.

Specifically, the doping concentration of the boron ions may be 1E15 cm$^{-3}$, 2E15 cm$^{-3}$, 3E15 cm$^{-3}$, 4E15 cm$^{-3}$, or 5E15 cm$^{-3}$. As the boron ions belong to the acceptor impurities, providing the hole carriers is equivalent to increasing the concentration of holes in the source region and the drain region and increasing the potential of the source-drain region. Within such concentration range, the potential of the source-drain region increases as the concentration of the boron ion increases, and thus increasing the PN junction potential difference and reducing the leakage current, and thus having a better device performance.

When the doping concentration of the channel region P+ is 1E11 cm$^{-3}$~1E12 cm$^{-3}$ and the doping concentration of the boron ions in the source-drain region is 5E11 cm$^{-3}$~5E12 cm$^{-3}$, as compared with the prior art, the channel potential decreases by 0.1 volts (V)-3, and the potential difference between the channel region and the source-drain region is increased, so that the leakage current can be reduced and further the off-state current can be reduced.

It is well known by those skilled in the art that although the phosphorus is taken as an example in the foresaid arrangement, the other fifth group elements can still achieve the above-mentioned effect. The other fifth group elements in addition to the phosphorus, such as arsenic, antimony, etc., are still within the protection scope of the present disclosure.

According to the present disclosure, a fifth group element is added when the N-type channel of the thin-film transistor is deposited. The fifth group element is a donor impurity, to provide electronic carriers, i.e. the concentration of the electronic carriers in the channel region is increased such that the potential in the channel region is reduced, the potential difference between the source-drain region and the channel region is increased, and accordingly the potential barrier between the source drain region and the channel region is increased, so that the PN junction leakage current formed between the source drain polycrystalline silicon and the channel region is reduced.

Through the above method, or/and the boron ions are doped into the source-drain region, and accordingly increasing the concentration of holes in the source-drain region to increase the potential of the source-drain region, and increasing the potential difference between the source-drain region and the channel region, and also reducing the PN junction leakage current, so that the problem of relatively larger leakage current of the low-temperature polycrystalline silicon thin-film transistor can be solved, the electrical performance of the thin-film transistor can be improved, and the display quality of the display device including the low-temperature polycrystalline silicon thin-film transistor can be improved.

Correspondingly, the array substrate provided by the present disclosure is improved on the basis of the foresaid thin-film transistor, so that the array substrate naturally possesses all the advantages of the thin-film transistor.

Correspondingly, the display device provided by the present disclosure is improved on the basis of the array substrate, so that the display device naturally possesses all the advantages of the thin-film transistor.

Figure 4:
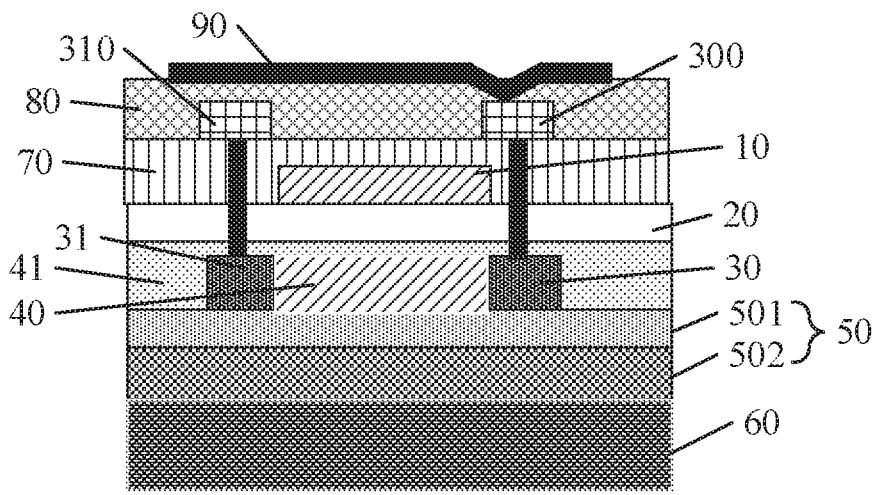
FIG. 4 shows a schematic structural view of an array substrate provided by the present disclosure.

Correspondingly, the present disclosure also provides an array substrate, and a schematic structural view of the array substrate is shown in FIG. 4. The array substrate includes the above-mentioned thin-film transistor, which adopts the thin-film transistor as described in the above-mentioned arrangement.

As shown in FIG. 4, a channel region protective layer 41 and a gate insulating layer 20 are sequentially deposited on a substrate on which the active region is deposited, and a gate 10 is formed on the gate insulating layer. An inter-layer insulating layer 70, a source electrode 310 and a drain electrode 300 are deposited on the gate 10. The source electrode 310 and the drain electrode 310 are respectively connected with a source region and a drain region of the active layer through a via, and an inter-layer insulating layer 70 (ILD layer), a PLN layer 80 and a lead 90 are sequentially deposited on the gate.

Correspondingly, the present disclosure also provides a display device, which includes the array substrate. The display device may be any product or component with a display function, such as an electronic paper, a display panel, an OLED panel, a mobile phone, a tablet computer, a television, a display, a notebook computer, a digital photo frame, a navigator and the like.

Since the array substrate and the display device are improved on the basis of the thin-film transistor, the array substrate and the display device naturally possess all the advantages of the thin-film transistor.

As above described, the present disclosure provides a method for doping fifth group elements in the amorphous silicon layer by changing the ions doping or directly injecting the fifth group elements into the polycrystalline silicon layer by the ion introduction, to form an N-type channel doped with fifth group elements and reduce the channel potential, or to increase the doping concentration of the boron ions so as to improve the potential in the source region and the drain region. The above two methods can increase the potential difference between the source-drain region and the channel region and reduce the leakage current, and thus reducing the off-state current and improving pixel quality in the display device.

Although some exemplary arrangements of the present disclosure have been shown above, it should be appreciated by those skilled in the art that modifications or equivalent substitutions can be made to these exemplary arrangements without departing from the principles or spirit of the present disclosure, and the scope of the present disclosure is defined by the claims as well as the equivalents thereof.

What is claimed is:

1. A thin-film transistor, comprising:
    an active layer, the active layer comprising:
        a channel region comprising a polycrystalline silicon structure doped with a fifth group element, wherein the polycrystalline silicon structure is formed by doping the fifth group element in a process of depositing amorphous silicon layer; and
        a source region and a drain region on both sides of the channel region, respectively;
    wherein the source region and the drain region are polycrystalline silicon doped with boron ions;
    wherein a doping concentration of the fifth group element is about $10^{11}$~$10^{12}$ cm$^{-3}$, and a distribution of the fifth group element is uniform; and
    wherein a doping concentration of the boron ions is about $10^{15}$-$5\times10^{15}$ cm$^{-3}$.

2. The thin-film transistor according to claim 1, wherein the fifth group element is phosphorus or arsenic.

3. The thin-film transistor according to claim 1, wherein the thin-film transistor is an N-type thin-film transistor.

4. The thin-film transistor according to claim 1, further comprising:
    a substrate; and
    a buffer layer on one side of the substrate;
    wherein the active layer, a gate insulating layer, and a gate are sequentially laminated on one side of the buffer layer away from the substrate, and the gate corresponds to a position of the channel region.

5. The thin-film transistor according to claim 4, wherein the substrate further comprises:
    a base substrate, wherein the base substrate is a glass base substrate or a flexible base substrate; and
    a polyimide resin on the base substrate.

6. The thin-film transistor of claim 4, wherein the buffer layer is a two-layer structure.

7. The thin-film transistor of claim 6, wherein the buffer layer comprises a SiN layer and a SiO$_2$ layer formed on the SiN layer.

8. An array substrate, comprising the thin-film transistor according to claim 1.

9. A display device, comprising the array substrate according to claim 8.

10. A manufacturing method of a thin-film transistor, comprising:
    forming an active layer of the thin-film transistor, the active layer comprising a channel region which is a polycrystalline silicon structure doped with a fifth group element, wherein forming the active layer of the thin-film transistor comprises doping the fifth group element in a process of depositing amorphous silicon layer; and
    forming a gate of the thin-film transistor on the polycrystalline silicon layer, using the gate as a mask doping the active layer with boron ions to form a source region and a drain region of the active layer,
    wherein a doping concentration of the fifth group element is about $10^{11}$~$10^{12}$ cm$^{-3}$, a distribution of the fifth group element is uniform, and a doping concentration of the boron ions is about $10^{15}$-$5\times10^{15}$ cm$^{-3}$.

11. The manufacturing method of the thin-film transistor according to claim 10, wherein forming the active layer of the thin-film transistor further comprises:
    crystallizing the amorphous silicon layer; and
    forming a polycrystalline silicon layer doped with the fifth group element.

12. The manufacturing method of the thin-film transistor according to claim 11, wherein reaction gases employed in forming the amorphous silicon layer doped with the fifth group element are H$_2$, PH$_3$, and SiH$_4$, a gas ratio is 1:0.15-0.35:0.1-0.3, and a reaction temperature is 250° C.-450° C.

13. A method, comprising:
    providing a thin-film transistor comprising an active layer, the active layer comprising:

a channel region comprising a polycrystalline silicon structure doped with a fifth group element, wherein the polycrystalline silicon structure is formed by doping the fifth group element in a process of depositing amorphous silicon layer; and a source region and a drain region on both sides of the channel region, respectively;

wherein the source region and the drain region are polycrystalline silicon doped with boron ions;

wherein a doping concentration of the fifth group element is about $10^{11}$~$10^{12}$ cm$^{-3}$, and a distribution of the fifth group element is uniform; and wherein a doping concentration of the boron ions is about $10^{15}$-$5\times10^{15}$ cm$^{-3}$.

14. The method according to claim 13, wherein the fifth group element is phosphorus or arsenic.

15. The method according to claim 13, wherein the thin-film transistor is an N-type thin-film transistor.

16. The method according to claim 13, wherein the thin-film transistor as provided further comprises:

a substrate; and a buffer layer on one side of the substrate;

wherein the active layer, a gate insulating layer, and a gate are sequentially laminated on one side of the buffer layer away from the substrate, and the gate corresponds to a position of the channel region.

17. The method according to claim 16, wherein the substrate further comprises:

a base substrate, wherein the base substrate is a glass base substrate or a flexible base substrate; and a polyimide resin on the base substrate.

18. The method of claim 16, wherein the buffer layer is a two-layer structure.

19. The method of claim 18, wherein the buffer layer comprises a SiN layer and a SiO$_2$ layer formed on the SiN layer.

* * * * *